(12) United States Patent
Kato

(10) Patent No.: US 9,960,739 B2
(45) Date of Patent: May 1, 2018

(54) SEMICONDUCTOR INTEGRATED CIRCUIT

(71) Applicant: ROHM CO., LTD., Ukyo-Ku, Kyoto (JP)

(72) Inventor: Takenori Kato, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days. days.

(21) Appl. No.: 15/189,481

(22) Filed: Jun. 22, 2016

(65) Prior Publication Data
US 2016/0373073 A1  Dec. 22, 2016

(30) Foreign Application Priority Data

Jun. 22, 2015 (JP) ................. 2015-124952

(51) Int. Cl.
*H03G 11/00* (2006.01)
*H03F 1/52* (2006.01)
(Continued)

(52) U.S. Cl.
CPC ............. *H03F 1/523* (2013.01); *H03F 3/187* (2013.01); *H03F 3/2173* (2013.01); *H04R 3/00* (2013.01); *H03F 2200/03* (2013.01); *H03F 2200/345* (2013.01); *H03F 2200/348* (2013.01); *H03F 2200/351* (2013.01); *H03F 2200/447* (2013.01); *H03F 2200/462* (2013.01); *H04R 3/04* (2013.01); *H04R 2430/01* (2013.01)

(58) Field of Classification Search
CPC ................. H03F 1/523; H03F 2200/03; H03F 2200/345; H03F 2200/348; H03F 2200/351; H03F 2200/447; H03F 2200/462; H03F 3/187; H03F 3/2173; H04R 2430/01; H04R 3/00; H04R 3/04
USPC ...... 381/55; 341/143, 155; 318/400.04, 599; 323/283; 330/250, 251, 252, 253, 260
See application file for complete search history.

(56) References Cited

U.S. PATENT DOCUMENTS

2003/0071595 A1* 4/2003 Cho ..................... H02P 7/03
                                                                318/599
2006/0022656 A1* 2/2006 Leung ................ H02M 3/157
                                                                323/283

(Continued)

FOREIGN PATENT DOCUMENTS

JP          2000346909 A     12/2000

*Primary Examiner* — Paul S Kim
*Assistant Examiner* — Friedrich W Fahnert
(74) *Attorney, Agent, or Firm* — Cantor Colburn LLP

(57) ABSTRACT

A pulse modulator receives an analog voltage $V_{IN}$, and generates a pulse signal that is modulated according to the analog voltage $V_{IN}$. An output stage generates a switching signal at an output terminal according to the pulse signal. A semiconductor integrated circuit is switchable between (i) a normal mode in which a main signal $V_{MAIN}$ to be used in a normal operating mode is input as the analog voltage $V_{IN}$ to the pulse modulator, and (ii) a test mode in which at least one internal analog signal $V_{AUX}$ generated in the semiconductor integrated circuit is input as the analog voltage $V_{IN}$ to the pulse modulator.

13 Claims, 9 Drawing Sheets

(51) Int. Cl.
  *H03F 3/217*  (2006.01)
  *H04R 3/00*  (2006.01)
  *H03F 3/187*  (2006.01)
  *H04R 3/04*  (2006.01)

(56) References Cited

U.S. PATENT DOCUMENTS

| | | | | |
|---|---|---|---|---|
| 2006/0220938 A1* | 10/2006 | Leung | ............... | H02M 3/33515 |
| | | | | 341/155 |
| 2011/0279072 A1* | 11/2011 | Shimizu | .................... | H02P 6/16 |
| | | | | 318/400.04 |
| 2015/0229324 A1* | 8/2015 | Soenen | .................. | H03H 17/00 |
| | | | | 341/143 |

* cited by examiner $V_{MAIN}$

S2
(S1)

$V_{AUX1}$

S2
(S1)

V4

SEMICONDUCTOR INTEGRATED CIRCUIT

CROSS-REFERENCE TO RELATED APPLICATIONS

This application is based upon and claims the benefit of priority from the prior Japanese Patent Application No. 2015-124952, filed Jun. 22, 2015, the entire contents of which are incorporated herein by reference.

BACKGROUND OF THE INVENTION

1. Field of the Invention

The present invention relates to a semiconductor integrated circuit, and particularly to a checking and analyzing technique for a semiconductor integrated circuit.

2. Description of the Related Art

FIGS. 1A through 1C are schematic diagrams each showing a semiconductor integrated circuit 300. FIG. 1A shows a schematic configuration of a semiconductor substrate (which will also be referred to as a "chip" or "die") 302 on which circuit elements are formed in a pre-processing step. The semiconductor substrate 302 has: an element formation region 302a in which circuit elements such as transistors, wiring patterns, resistors, and the like are integrated; and an I/O region 302b configured as an outer edge portion of the semiconductor substrate 302 in which multiple I/O pads 304 are formed.

FIG. 1B shows the semiconductor integrated circuit 300 in a post-processing step. The semiconductor substrate 302 is mounted (by means of die bonding) on an island 309. Each of the I/O pads 304 of the semiconductor integrated circuit 300 is electrically connected to a corresponding lead terminal (pin) 308 via a bonding wire 310. After the wire bonding step, the semiconductor integrated circuit 300 is sealed by means of resin 312. The semiconductor integrated circuits 300 that operate normally are selected in an electrical characteristics check step, and the normal semiconductor integrated circuits 300 thus selected are shipped.

In recent years, accompanying advances in the multi-functionalization and circuit density of the semiconductor integrated circuit 300, the number of electrical characteristics to be checked in the check step has been steadily increasing. However, the number of lead terminals 308 (the number of leads) is limited. Accordingly, it is difficult to check all the characteristics after mold sealing.

In order to solve such a problem, as shown in FIGS. 1A and 1B, the semiconductor substrate 302 is provided with check pads 306 in addition to the I/O pads 304. Each check pad 306 is connected to a node included in the semiconductor substrate 302, which is to be checked but is not connected to any I/O pad 304. For example, the semiconductor substrate 302 includes, as a built-in component, a reference voltage source 303 configured as a bandgap reference circuit or the like. With such an arrangement, an output node of the reference voltage source 303 is connected to such a check pad 306.

In the wafer check step before the packaging step, a probe is applied such that it is in contact with a corresponding check pad 306. Such an arrangement allows the voltage $V_{REF}$ of the reference voltage source 303 to be checked. Instead of increasing the number of lead terminals 308, by increasing the number of check pads 306, such an arrangement allows a great number of electrical characteristics to be checked.

As a result of investigating such a semiconductor integrated circuit 300 shown in FIG. 1, the present inventors have come to recognize the following problem.

After the semiconductor integrated circuit 300 is shipped as a normal product, in some cases, a defect or a malfunction occurs. Also, after judgment is made in the wafer check step that the semiconductor integrated circuit 300 operates normally, in some cases, judgement is made that it is defective in a test after the assembly step.

However, after the mold sealing, the check pads 306 cannot be accessed. Such an arrangement limits the analysis of the semiconductor integrated circuit 300, which is a problem. It should be noted that such a problem is by no means within the scope of common and general knowledge of those skilled in this art.

SUMMARY OF THE INVENTION

The present invention has been made in order to solve such a problem. Accordingly, it is an exemplary purpose of an embodiment of the present invention to provide a semiconductor integrated circuit in which electrical characteristics can be checked and analyzed after an assembly step.

An embodiment of the present invention relates to a semiconductor integrated circuit. The semiconductor integrated circuit comprises: an output terminal; a pulse modulator that receives an analog voltage, and that generates a pulse signal modulated according to the analog voltage thus received; and an output stage that generates a switching signal at the output terminal according to the pulse signal. The semiconductor integrated circuit is switchable between (i) a normal mode in which a main signal to be used in a normal operating mode is input as the analog voltage to the pulse modulator, and (ii) a test mode in which at least one internal analog signal generated in the semiconductor integrated circuit is input as the analog voltage to the pulse modulator.

With such an embodiment, when the operating mode is set to the test mode, the switching pulse is output via a switching terminal according to the voltage level of the internal analog signal. Thus, even after the assembly step, by analyzing the switching pulse, such an arrangement allows the internal analog signal to be measured, thereby allowing its electrical characteristics to be checked and analyzed. Such an arrangement requires only a configuration for switching the signal input to the pulse modulator, thereby requiring only a negligible increase in the cost, which is another advantage.

With an embodiment, the semiconductor integrated circuit may further comprise a multiplexer that receives the main signal and the at least one internal analog signal, selects one from among the signals thus received, and outputs the signal thus selected to the pulse modulator.

By switching the state of the multiplexer, such an arrangement is capable of switching the operating mode between the normal mode and the test mode.

With an embodiment, the at least one internal analog signal may include a detection voltage output from a sensor built into the semiconductor integrated circuit. Also, the at least one internal analog signal may include a detection voltage output from a temperature sensor included in an overheat protection circuit built into the semiconductor integrated circuit. Also, the at least one internal analog signal may include a detection voltage output from a current sensor included in an overcurrent protection circuit built into the semiconductor integrated circuit. Also, the at least one internal analog signal may include a reference voltage. Also, the at least one internal analog signal may include a threshold voltage set for a protection circuit.

With an embodiment, the semiconductor integrated circuit may further comprise a digital signal processing circuit. Also, (iii) in the test mode, it may be possible for at least one internal digital signal generated by the digital signal processing circuit to be input to the output stage.

With an embodiment, the output stage may comprise: a high-side transistor arranged between a power supply terminal and the output terminal; a low-side transistor arranged between the output terminal and a ground terminal; and a driver that drives the high-side transistor and the low-side transistor according to the pulse signal.

Another embodiment of the present invention relates to an audio amplifier circuit. The audio amplifier circuit may comprise any one of the aforementioned semiconductor integrated circuits. The pulse modulator may comprise: an error amplifier that receives, via an inverting input terminal thereof, the analog voltage and a voltage fed back from the output terminal, and that receives a reference voltage via a non-inverting input terminal thereof; and a comparator that compares an output voltage of the error amplifier with a cyclic voltage, and that outputs a pulse signal that indicates a comparison result. Also, the output stage may comprise a class D amplifier.

Yet another embodiment of the present invention relates to an electronic device. The electronic device may comprise: an electroacoustic conversion element; and an audio amplifier circuit that drives the electroacoustic conversion element.

With yet another embodiment of the present invention, the semiconductor integrated circuit may be configured as a control circuit for a switching regulator. With yet another embodiment, the semiconductor integrated circuit may be configured as a motor driver circuit.

It is to be noted that any arbitrary combination or rearrangement of the above-described structural components and so forth is effective as and encompassed by the present embodiments. Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Figure 1A:
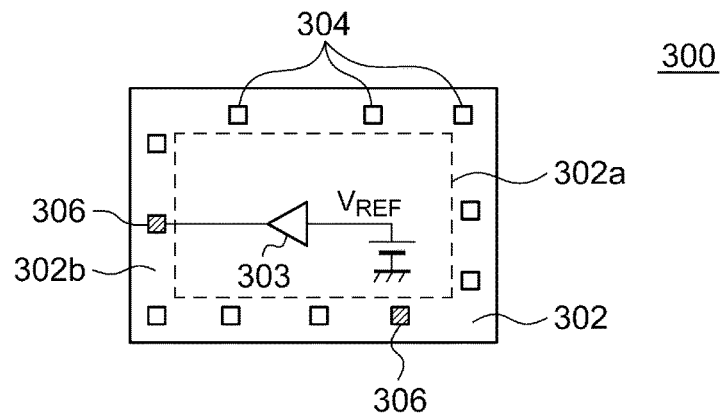
FIGS. 1A through 1C are schematic diagrams each showing a semiconductor integrated circuit.

The invention will now be described based on preferred embodiments which do not intend to limit the scope of the present invention but exemplify the invention. All of the features and the combinations thereof described in the embodiment are not necessarily essential to the invention.

Description will be made below regarding preferred embodiments according to the present invention with reference to the drawings. The same or similar components, members, and processes are denoted by the same reference numerals, and redundant description thereof will be omitted as appropriate. The embodiments have been described for exemplary purposes only, and are by no means intended to restrict the present invention. Also, it is not necessarily essential for the present invention that all the features or a combination thereof be provided as described in the embodiments.

In the present specification, the state represented by the phrase "the member A is connected to the member B" includes a state in which the member A is indirectly connected to the member B via another member that does not affect the electric connection therebetween, in addition to a state in which the member A is physically and directly connected to the member B.

Similarly, the state represented by the phrase "the member C is provided between the member A and the member B" includes a state in which the member A is indirectly connected to the member C, or the member B is indirectly connected to the member C via another member that does not affect the electric connection therebetween, in addition to a state in which the member A is directly connected to the member C, or the member B is directly connected to the member C.

Figure 2:
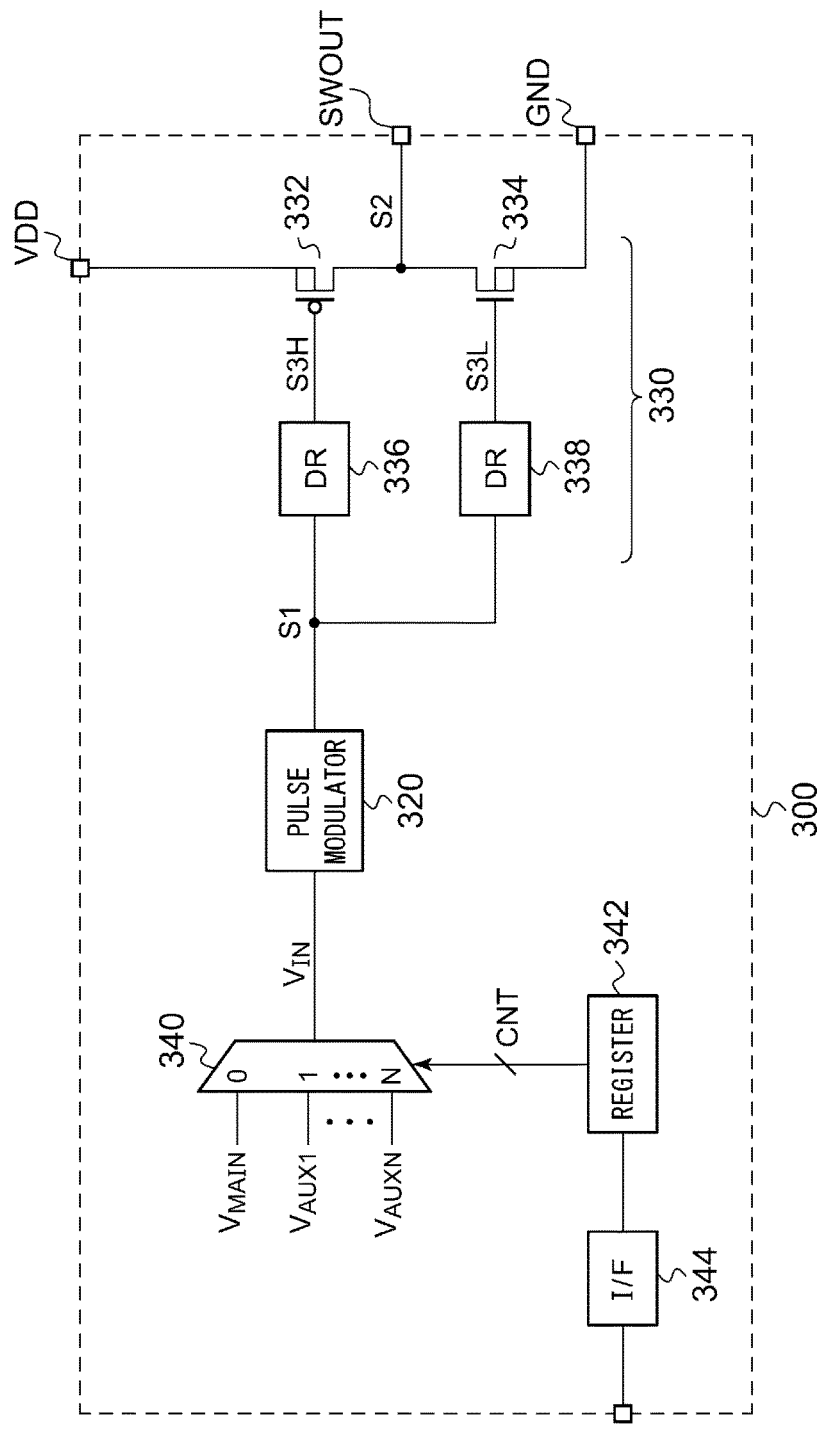
FIG. 2 is a circuit diagram showing a semiconductor integrated circuit according to an embodiment.

FIG. 2 is a circuit diagram showing a semiconductor integrated circuit 300 according to an embodiment. The semiconductor integrated circuit 300 includes a pulse modulator 320, an output stage 330, and a multiplexer 340. Furthermore, the semiconductor integrated circuit 300 is provided with a power supply terminal (VDD), an output terminal (SWOUT), and a ground terminal (GND). The usage of the semiconductor integrated circuit 300 is not restricted in particular. For example, the semiconductor integrated circuit 300 may be applicable to an audio amplifier including a Class D amplifier, a control circuit for a switching regulator, a motor driver, and the like.

The pulse modulator 320 receives an analog voltage $V_{IN}$, and generates a pulse signal S1 modulated according to the analog voltage $V_{IN}$ thus received. The configuration and the modulation method employed in the pulse modulator 320 are not restricted in particular. The output stage 330 generates a switching signal S2 at the SWOUT terminal according to the pulse signal S1. The output stage 330 includes a high-side transistor 332, a low-side transistor 334, a high-side driver 336, and a low-side driver 338, for example. The high-side transistor 332 is arranged between the VDD terminal and the SWOUT terminal. The low-side transistor 334 is arranged between the SWOUT terminal and the GND terminal. The high-side driver 336 and the low-side driver 338 drive the high-side transistor 332 and the low-side transistor 334, respectively, according to the pulse signal S1.

The high-side driver 336 outputs a gate pulse S3H to the gate of the high-side transistor 332. The low-side driver 338 outputs a gate pulse S3L to the gate of the low-side transistor 334.

The semiconductor integrated circuit 300 is switchable between (i) a normal mode in which a main signal $V_{MAIN}$ is input as the analog voltage $V_{IN}$ to the pulse modulator 320, and (ii) a test mode in which at least one from among internal analog signals $V_{AUX1}$ through $V_{AUXN}$ is input as the analog voltage $V_{IN}$ to the pulse generator 320.

The multiplexer 340 is provided in order to allow the mode to be switched between the normal mode and the test mode. The multiplexer 340 receives the main signal $V_{MAIN}$ and at least one or more internal analog signals $V_{AUX1}$ through $V_{AUXN}$. In the normal mode, the multiplexer 340 selects the main signal $V_{MAIN}$. In the test mode, the multiplexer 340 selects one from among the internal analog voltage signals $V_{AUX1}$ through $V_{AUXN}$, and outputs the internal analog signal thus selected to the pulse modulator 320. The multiplexer 340 is controllable according to a control signal CNT. For example, the multiplexer 340 is controllable according to a value stored in a register 342 at a predetermined address. The value stored in the register 342 is rewritable from an external circuit via interface circuit 344. For example, an I²C (Inter IC) BUS interface is employed.

The initial value stored in the register 342 is determined so as to instruct the multiplexer 340 to select the main signal $V_{MAIN}$. Accordingly, before the value stored in the register 342 is rewritten, the semiconductor integrated circuit 300 operates in the normal mode. For example, when the register 342 stores a value of 0, the main signal $V_{MAIN}$ is selected. On the other hand, when the register 342 stores a value of 1 to N, the multiplexer 340 selects a corresponding one from among the internal analog signals $V_{AUX1}$ through $V_{AUXN}$.

Figure 3A:
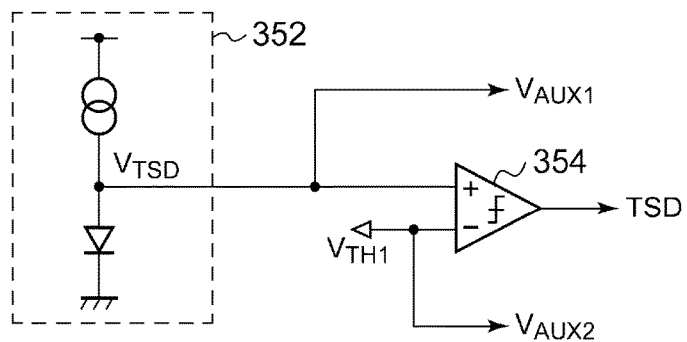
FIGS. 3A through 3C are circuit diagrams showing internal analog signals $V_{AUX}$.
Figure 3B:
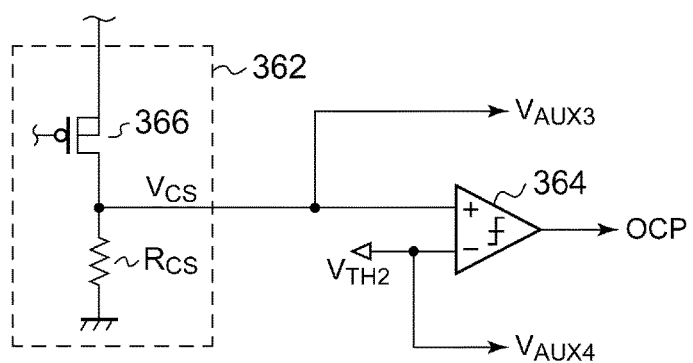
Figure 3C:
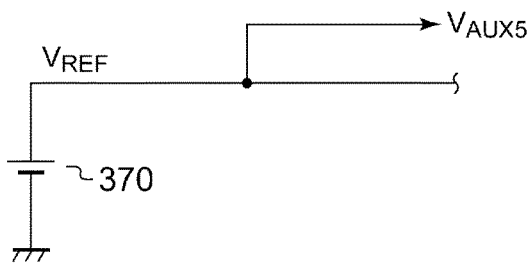

Next, description will be made regarding the internal analog signals $V_{AUX}$. The kinds of such internal analog signals $V_{AUX}$ are not restricted in particular. Rather, desired signals, which can be effectively used for analysis, may preferably be employed. FIGS. 3A through 3C are circuit diagrams each showing such an internal analog signal $V_{AUX}$.

FIG. 3A is a circuit diagram showing an overheat protection circuit 350 built into the semiconductor integrated circuit 300. The overheat protection circuit 350 is also referred to as the "thermal shutdown (TSD) circuit". The overheat protection circuit 350 includes a temperature sensor 352 and a comparator 354. The temperature sensor 352 generates a detection voltage $V_{TSD}$ that corresponds to the chip temperature. The configuration of the temperature sensor 352 is not restricted in particular. For example, the temperature sensor 352 may include a diode and a current source, and be configured as a circuit that detects the temperature using the temperature dependency of the forward voltage $V_F$ of the diode. Also, the temperature sensor 352 may include two diodes that provide different current densities. With such an arrangement, the voltage difference between two forward voltages of the two diodes may be used to detect the temperature. The comparator 354 compares the detection voltage $V_{TSD}$ with a threshold voltage $V_{TH1}$ that corresponds to a threshold temperature set for the overheat protection. With such an arrangement, the comparator 354 judges whether or not the temperature exceeds the threshold temperature, and generates a TSD signal which is asserted (e.g., set to the high level) when an overheat state occurs in the semiconductor integrated circuit 300. In order to provide improved stability, the comparator 354 may be configured as a hysteresis comparator.

With the semiconductor integrated circuit 300 including the overheat protection circuit 350, the output voltage $V_{TSD}$ of the temperature sensor 352 may be employed as a given internal analog signal $V_{AUX1}$. Also, as another internal analog signal $V_{AUX2}$, the threshold voltage $V_{TH1}$ may be employed.

FIG. 3B is a circuit diagram showing an overcurrent protection (OCP) circuit 360 built into the semiconductor integrated circuit 300. The overcurrent protection circuit 360 judges whether or not a monitoring target current that flows through an internal circuit or otherwise an external circuit of the semiconductor integrated circuit 300 exceeds a threshold current. The overcurrent protection circuit 360 includes a current sensor 362 and a comparator 364. The current sensor 362 converts the monitoring target current into a detection voltage $V_{CS}$. With the semiconductor integrated circuit 300 shown in FIG. 2, a current that flows through the high-side transistor 332 or otherwise the low-side transistor 334 is employed as the monitoring target.

The configuration of the current sensor 362 is not restricted in particular. The current sensor 362 includes a detection resistor $R_{CS}$. The detection resistor $R_{CS}$ is arranged on a path through which the monitoring target current flows, or otherwise on a path through which a current flows in proportion to the monitoring target current. FIG. 3B shows an example in which the current that flows through the high-side transistor 332 is employed as the monitoring target current. The transistor 366 is arranged such that its gate is connected to the gate of the high-side transistor 332 so as to form a common gate. With such an arrangement, a current flows through the transistor 366 in proportion to the current that flows through the high-side transistor 332. Accordingly, a voltage drop (detection voltage $V_{CS}$) occurs at the detection resistor $R_{CS}$ in proportion to the current that flows through the high-side transistor 332. The comparator 364 compares the detection voltage $V_{CS}$ with a threshold voltage $V_{TH2}$ that corresponds to a threshold value for the overcurrent protection. Specifically, the comparator 364 judges whether or not the current exceeds the threshold value, and asserts an OCP signal when the overcurrent state occurs. Also, the on-resistance of the high-side transistor 332 or otherwise the on-resistance of the low-side transistor 334 may be used as the detection resistor $R_S$. In this case, the voltage drop (drain-source voltage) that occurs at the high-side transistor 332 or otherwise the low-side transistor 334 may be used as the detection voltage $V_{CS}$. Also, the comparator 354 may be configured as a hysteresis comparator in order to provide improved stability.

With the semiconductor integrated circuit 300 including the overheat protection circuit 360, the detection voltage $V_{CS}$ generated by the current sensor 362 may be employed as a given internal analog signal $V_{AUX3}$. Also, as another internal analog signal $V_{AUX4}$, the threshold voltage $V_{TH2}$ may be employed.

FIG. 3C shows a voltage source 370 built into the semiconductor integrated circuit 300. The voltage source 370 is configured as a bandgap reference circuit or as another kind of voltage source. The voltage source 370 generates a stabilized reference voltage $V_{REF}$. With the semiconductor integrated circuit 300 including the voltage source 370, the reference voltage $V_{REF}$ may be employed as a given internal analog signal $V_{AUX5}$.

Other examples of signals that can be employed as an internal analog signal $V_{AUX}$ include a threshold voltage set for an overvoltage protection (OVP) circuit, a threshold voltage set for an undervoltage lockout (UVLO) circuit, and the like.

The above is the configuration of the semiconductor integrated circuit 300. Next, description will be made regarding the operation thereof.

[Normal Mode]

Figure 4A:
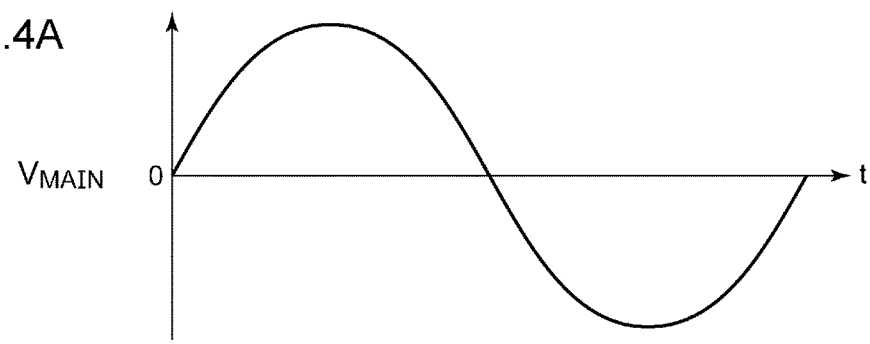
FIG. 4A is a waveform diagram showing the operation in the normal mode.
Figure 4A:
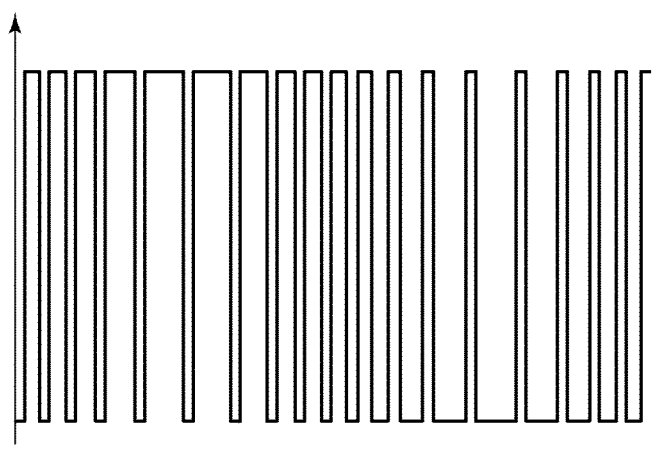

FIG. 4A is a waveform diagram showing the operation in the normal mode. In this mode, the register 342 stores an initial value of zero. In this case, the main signal $V_{MAIN}$ is supplied to the pulse modulator 320. The main signal $V_{MAIN}$ changes with time. The duty ratio of the switching signal S2 (S1) changes according to a change in the main signal $V_{MAIN}$.

[Test Mode]

Figure 5:
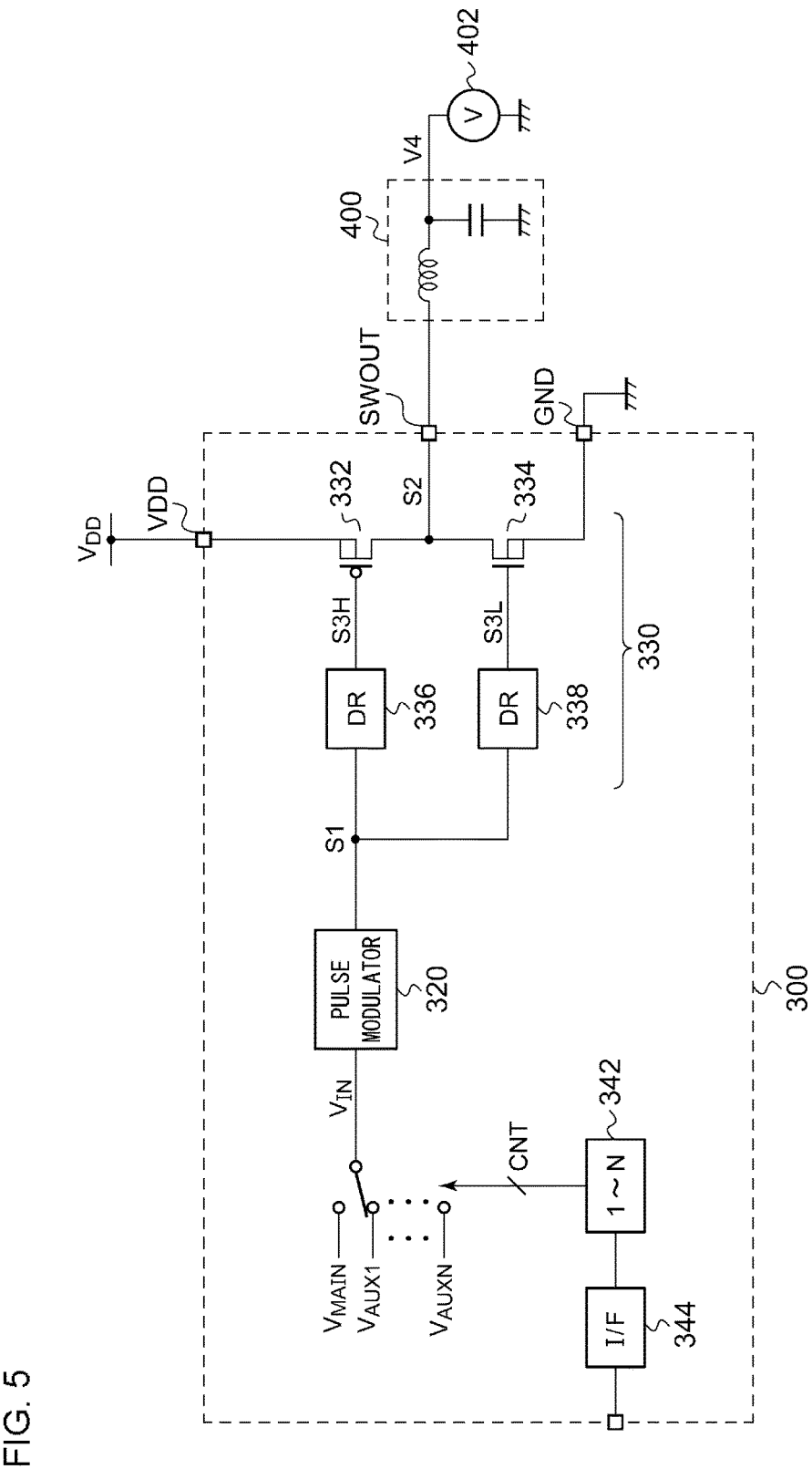
FIG. 5 is an equivalent circuit diagram showing an equivalent circuit of the semiconductor integrated circuit and its peripheral circuits in the test mode.

In a case in which there is a need to check and analyze the semiconductor integrated circuit 300 after mold sealing, the value of the register 342 is rewritten by means of an external circuit to a value from among the values 1 through N ($\neq 0$) that correspond to the internal analog signals $V_{AUX1}$ through $V_{AUXN}$. FIG. 5 is an equivalent circuit diagram showing the semiconductor integrated circuit 300 and its peripheral circuits in the test mode. In the same way as in the normal mode, the power supply voltage $V_{DD}$ and the ground voltage $V_{GND}$) are supplied to the VDD terminal and the GND terminal, respectively. A low-pass filter 400 is connected to the SWOUT terminal. The low-pass filter 400 is designed to have a cutoff frequency that is lower than the switching frequency of the switching signal S2. The configuration of the low-pass filter 400 is not restricted in particular. For example, the low-pass filter 400 may be configured as an LC filter or an RC filter. The low-pass filter 400 is not restricted to an active filter or otherwise a passive filter. Also, the filter order of the low-pass filter 400 is not restricted in particular. A voltmeter 402 measures a voltage V4 at a position after the signal passes through the low-pass filter 400.

Figure 4B:
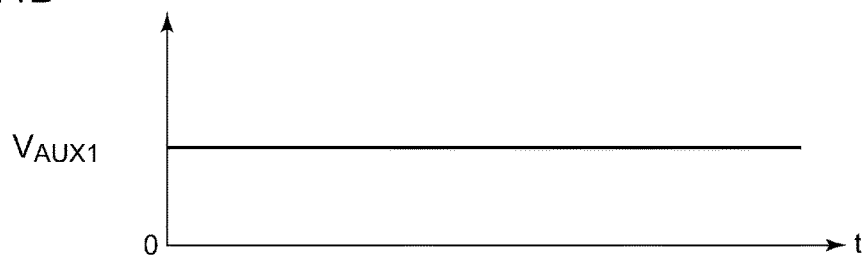
FIG. 4B is a waveform diagram showing the operation in the test mode.
Figure 4B:
Figure 4B:
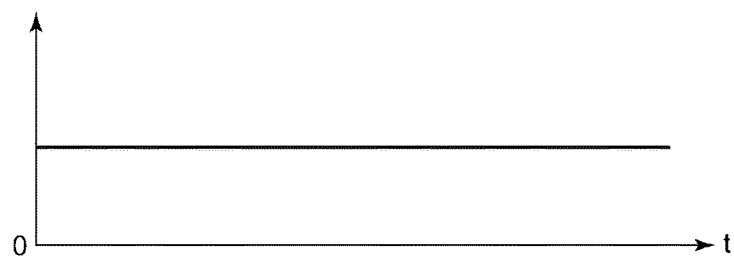

FIG. 4B is a waveform diagram showing the operation in the test mode. Description will be made regarding an example in which the internal analog signal $V_{AUX1}$ is measured. In this case, the value 1 is written to the register 342, which instructs the semiconductor integrated circuit 300 to input the internal analog signal $V_{AUX1}$ to the pulse generator 320. In this state, the pulse signal S1 and the switching signal S2 each have a duty ratio d that corresponds to the voltage level of the internal analog signal $V_{AUX1}$.

The voltage V4 represents an average level of the switching signal S2 (s1), which is represented by V4=d×$V_{DD}$. The voltage V4 has a correlation with the internal analog signal $V_{AUX1}$. Thus, by measuring the voltage V4, such an arrangement allows the voltage level of the internal analog signal $V_{AUX1}$ to be measured.

The present invention encompasses various kinds of apparatuses and circuits that can be regarded as a block configuration or a circuit configuration shown in FIG. 2, or otherwise that can be derived from the aforementioned description. That is to say, the present invention is not restricted to a specific circuit configuration. More specific description will be made below regarding an example configuration for clarification and ease of understanding of the essence of the present invention and the circuit operation. That is to say, the following description will by no means be intended to restrict the technical scope of the present invention.

First Embodiment

Figure 6:
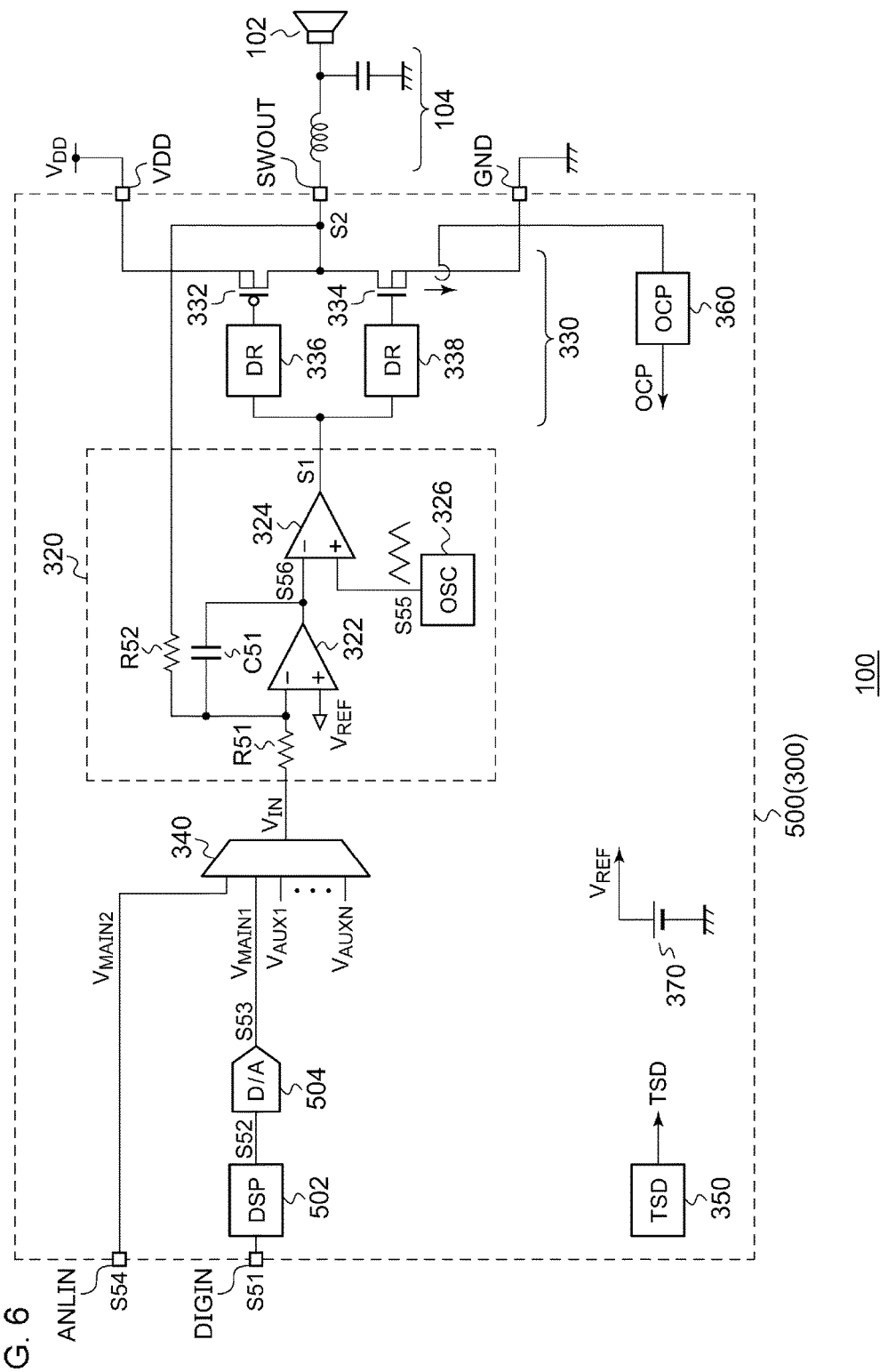
FIG. 6 is a circuit diagram showing an audio amplifier IC including the semiconductor integrated circuit.

FIG. 6 is a circuit diagram showing an audio amplifier IC (Integrated Circuit) 500 including the semiconductor integrated circuit 300. In the audio amplifier IC 500, the output stage 330 functions as a class D amplifier, which drives an electroacoustic conversion element configured as a speaker or headphones connected to an external circuit.

The audio amplifier IC 500 includes the pulse generator 320, the output stage 330, and the multiplexer 340 as described above. Furthermore, the audio amplifier IC 500 includes the overheat protection circuit 350, the overcurrent protection circuit 360, and the voltage source 370. The multiplexer 340 receives, as the internal analog signals $V_{AUX}$, voltages such as detection voltages, threshold voltages, and reference voltages, which are generated by the overheat protection circuit 350, the overcurrent protection circuit 360, and the voltage source 370.

A DSP (which will also be referred to as the "Digital Signal Processor" or "Digital Sound Processor") 502 processes a digital audio signal S51 input from an external circuit. Examples of the functions of the DSP 502 include digital volume control, equalizing, bass boost, and the like. A D/A converter 504 converts the digital audio signal S52 output from the DSP 502 into an analog audio signal S53. The analog audio signal S53 thus converted is input as the main signal $V_{MAIN}$ to the multiplexer 340. Also, in a case in which the audio amplifier IC 500 includes an analog audio interface, an analog audio signal S54 input from an external circuit may be employed as the main signal $V_{MAIN}$.

The pulse modulator 320 includes an error amplifier 322, a comparator 324, and an oscillator 326. The inverting input terminal (−) of the error amplifier 322 receives the analog voltage $V_{IN}$ from the multiplexer 340 via a resistor R51 and the switching signal S2 fed back from the SWOUT terminal via a resistor R52. A capacitor C51 is arranged between the output and the inverting input terminal (−) of the error amplifier 322. The error amplifier 322 receives a reference voltage $V_{REF}$ at its non-inverting input terminal (+). It should be noted that the phase compensation method employed in the feedback system is not restricted in particular.

The oscillator 326 generates a cyclic voltage S55 having a triangle waveform or otherwise a sawtooth waveform. The comparator 324 compares an output voltage S56 of the error amplifier 322 with the cyclic voltage S55, and outputs the pulse signal S1 that indicates the comparison result.

The above is the configuration of the audio amplifier IC 500. The audio amplifier IC 500 is mounted on an electronic device 100. The SWOUT terminal of the audio amplifier IC 500 is connected to the electroacoustic conversion element 102 via a filter 104.

The audio amplifier IC 500 includes a pair of the output stages 330 each configured as a Class D amplifier. The electroacoustic conversion element 102 may be connected to such a pair of Class D amplifiers in a BTL (Bridged Transless/Bridge-Tied Load) manner.

It should be noted that the configuration of the pulse modulator 320 is not restricted to such an arrangement shown in FIG. 6. Also, other kinds of configurations may be employed.

Second Embodiment

Figure 7:
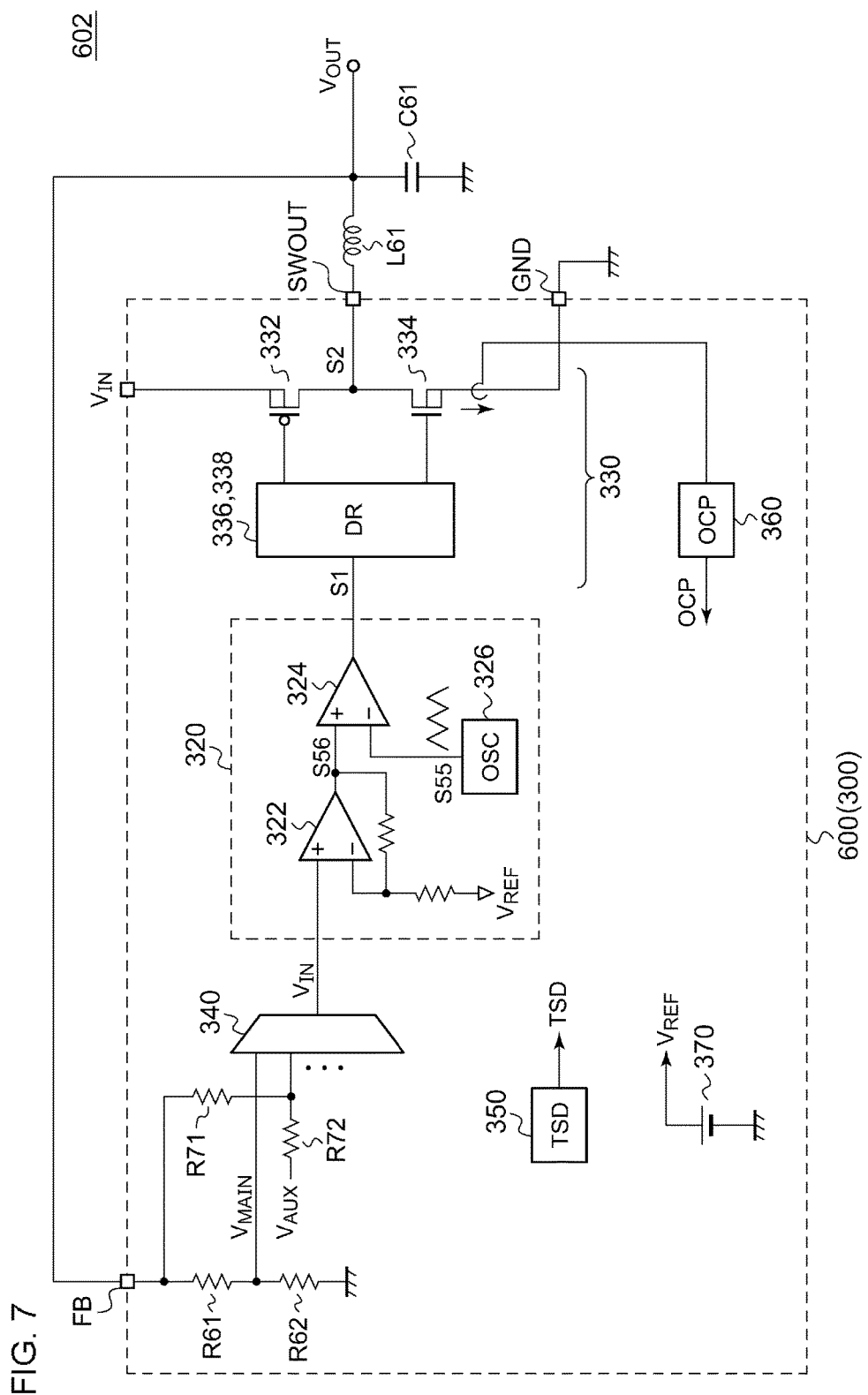
FIG. 7 is a circuit diagram showing a control IC for a switching regulator including the semiconductor integrated circuit.

FIG. 7 is a circuit diagram showing a control IC 600 for a switching regulator (DC/DC converter) including the semiconductor integrated circuit 300. The switching regulator 602 is configured as a step-down switching regulator. The switching regulator 602 includes a high-side transistor 332, a low-side transistor 334, an inductor L61, and an output capacitor C61, which are arranged with the same topology as a typical synchronous rectification step-down converter. The high-side transistor 332 functions as a switching transistor. The low-side transistor 334 functions as a synchronous rectification transistor.

The output voltage $V_{OUT}$ of the switching regulator 602 is input to a feedback terminal FB of the control IC 600. The output voltage $V_{OUT}$ is divided by means of resistors R61 and R62. The voltage thus divided is input as the main voltage $V_{MAIN}$ to the multiplexer 340.

The voltage difference between the voltage $V_{OUT}$ at the FB terminal and the internal analog signal $V_{AUX}$ is divided by means of resistors R71 and R72. The voltage thus divided is input to the multiplexer 340. By providing the resistors R71 and R72, the output voltage $V_{OUT}$ is also fed back in the test mode.

In the test mode, the inductor L61 and the capacitor C61 are connected to the control IC 600. The output S56 of the error amplifier 322 passes through the comparator 324 and the output stage 330, which generates a switching signal S2 at the SWOUT terminal according to the internal analog signal $V_{AUX}$. Thus, by monitoring the switching signal S2, such an arrangement allows the internal analog voltage $V_{AUX}$ to be measured.

It should be noted that the resistors R71 and R72 may be omitted. That is to say, the internal analog signal $V_{AUX}$ may be directly input to the multiplexer. With such an arrangement, in the test mode, the internal analog signal $V_{AUX}$ may be measured based on the duty ratio of the switching signal S2 output via the SWOUT terminal.

It should be noted that the configuration of the pulse modulator 320 is not restricted to an arrangement shown in FIG. 7. Rather, various kinds of other configurations may be employed. Also, the switching regulator 602 may be configured as a step-up switching regulator or a step-up/step-down switching regulator. Also, the switching regulator 602 may be configured as a flyback converter or a forward converter. Also, the present invention is applicable to a constant current output converter each including a transformer, in addition to a constant voltage output converter.

Third Embodiment

Figure 8:
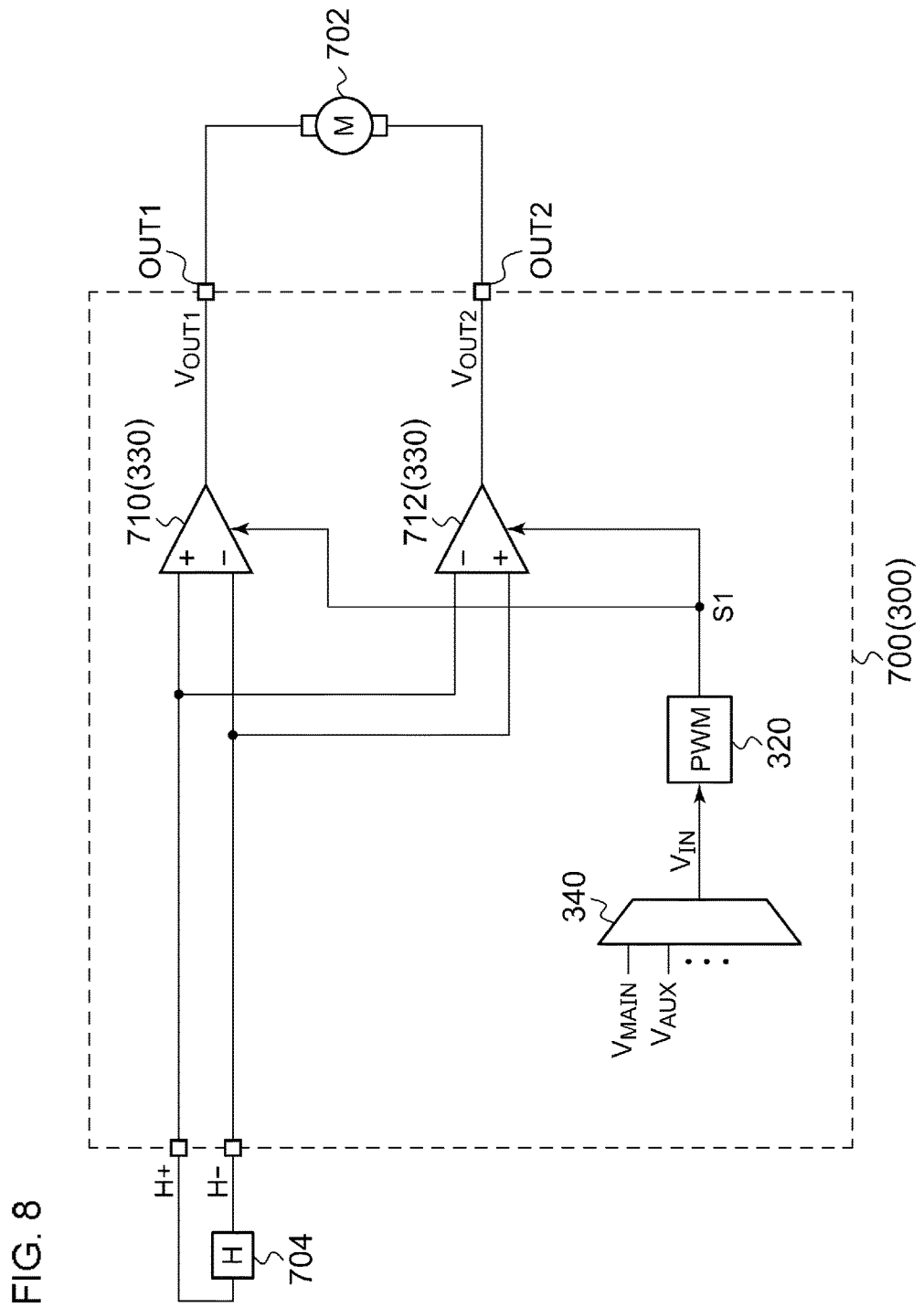
FIG. 8 is a circuit diagram showing a motor driver IC including the semiconductor integrated circuit.

FIG. 8 is a circuit diagram showing a motor driver IC 700 including the semiconductor integrated circuit 300. The motor driver IC 700 drives a single-phase motor 702. A Hall element 704 generates a pair of Hall signals H+ and H− which indicate the position of the rotor of the single-phase motor 702. Driving amplifiers 710 and 712 amplify the pair of Hall signals H+ and H− with opposite polarities, and output the signals thus amplified to both ends of the single-phase motor 702. The multiplexer 340 receives, as the main voltage $V_{MAIN}$, the voltage that indicates the torque (rotational speed) to be set for the single-phase motor 702. The internal analog signals $V_{AUX}$ are configured in the same manner as described above. The pulse signal S1 generated by the pulse modulator 320 is input to each of the driving amplifiers 710 and 712.

Figure 1B:
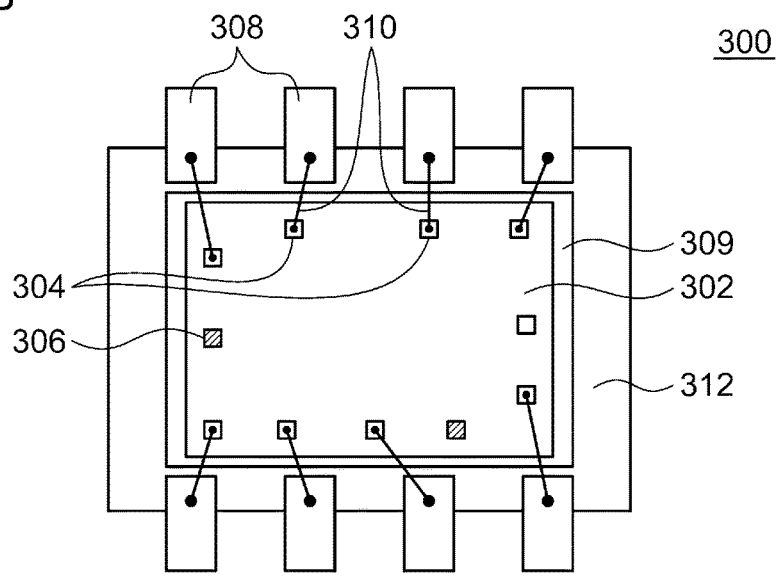
Figure 1C:
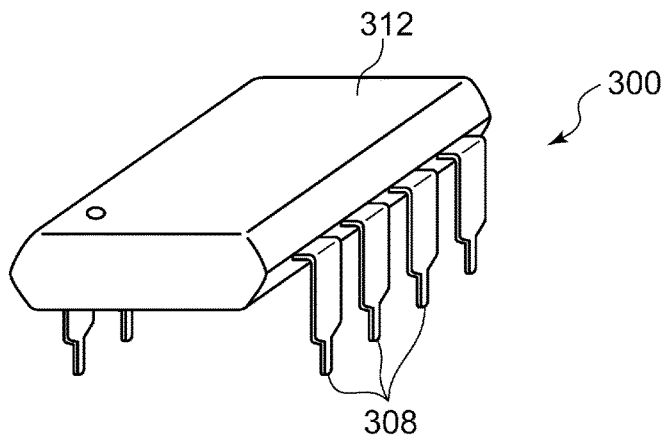

The driving amplifiers 710 and 712 correspond to the output stage 330. The driving amplifier 710 has a push-pull output configuration. That is to say, the driving amplifier 710 includes the high-side transistor 332 and the low-side transistor 334 as shown in FIG. 1. The driving amplifier 712 is also configured in the same manner. The high-side transistor 332 and the low-side transistor 334 are switched on and off according to the pulse signal S1. The output voltage $V_{OUT1}$ of the driving amplifier 710 has a pulse waveform switching on and off according to the pulse signal S1, and having an envelope curve that changes according to the Hall signals H+ and H−. The driving amplifier 712 operates in the same manner as in the driving amplifier 710.

The configuration of the pulse modulator 320 is not restricted in particular. Instead of such a single-phase motor 702, a three-phase motor may be employed. Also, the present invention is applicable to a sensorless motor driver IC 700 that does not employ such a Hall element 704.

Description has been made above regarding the present invention with reference to the embodiments. The above-described embodiments have been described for exemplary purposes only, and are by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

[First Modification]

There are several existing modifications of the output stage 330. For example, the high-side transistor 332 may be configured as an N-channel MOSFET. In this case, in order to generate a gate pulse signal S3H having a suitable voltage level, a bootstrap circuit may preferably be arranged as an additional circuit.

The high-side transistor 332 and the low-side transistor 334 may be externally connected to the semiconductor integrated circuit 300 in the form of discrete elements. In this case, the output nodes of the high-side driver 336 and the low-side driver 338 are configured as the output terminals of the semiconductor integrated circuit 300. Also, the high-side transistor 332 and the low-side transistor 334 may each be configured as a bipolar transistor or an IGBT (Insulated Gate Bipolar Transistor).

[Second Modification]

In the embodiments, the multiplexer 340 is controlled according to the value of the register 342. However, the present invention is not restricted to such an arrangement. For example, a control pin (terminal) may be arranged as an additional terminal in order to allow the multiplexer 340 to be controlled. Specifically, such an arrangement may be configured to allow the multiplexer 340 to be switched according to the voltage level applied to the control pin.

[Third Modification]

In the measurement in the test mode, the low-pass filter 400 and the voltmeter 402 as shown in FIG. 4 may be omitted. With such an arrangement, the duty ratio or otherwise the pulse width of the switching signal S2 may be measured using a digital counter or otherwise an analog timer circuit. In this case, the voltage level of the internal analog signal $V_{AUX}$ can be indirectly measured based on the duty ratio thus measured.

[Fourth Modification]

Instead of such a PWM modulator, the pulse modulator 320 may be configured as a PFM (pulse Frequency Modulation) modulator or a PDM (Pulse Density Modulation) modulator.

[Fifth Modification]

Figure 9:
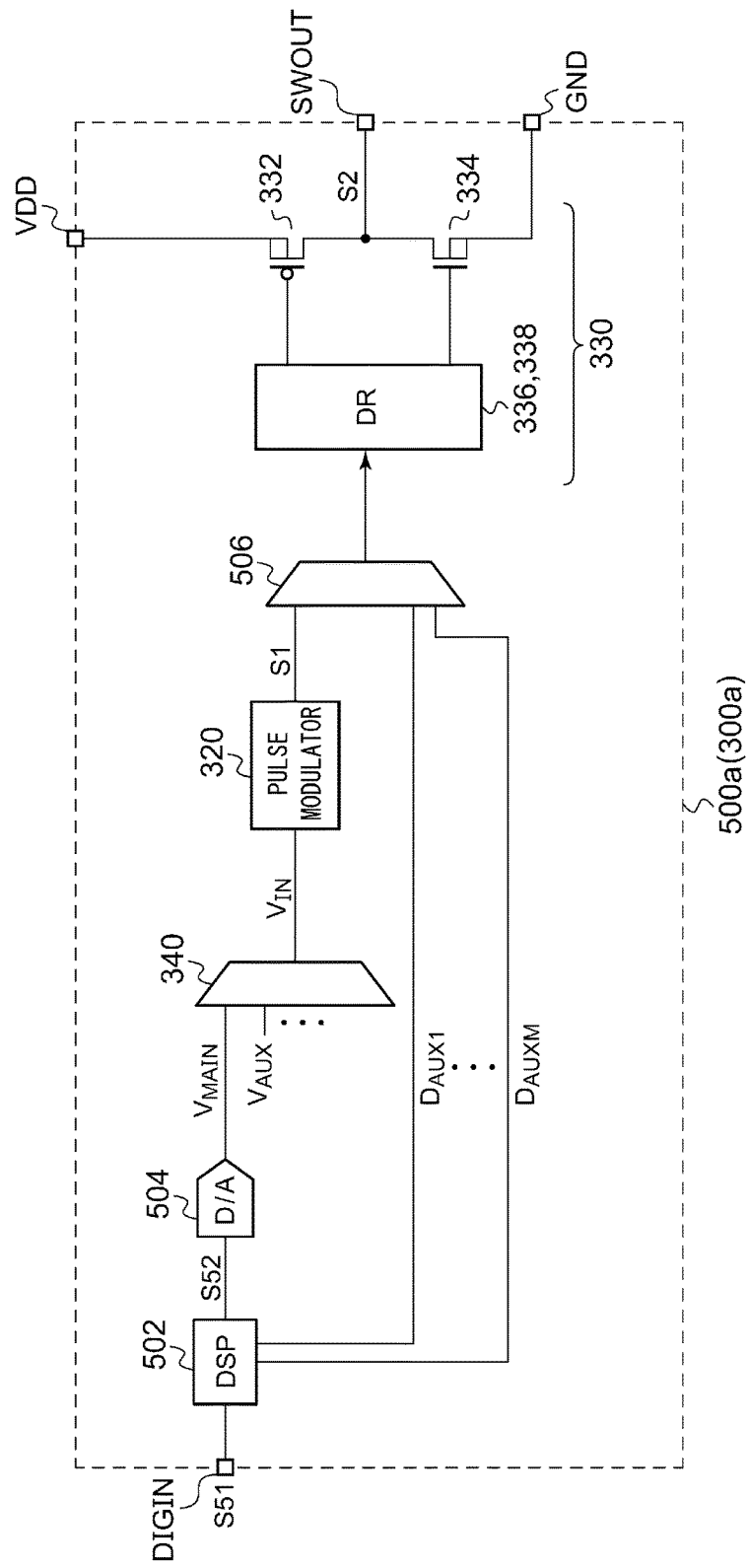
FIG. 9 is a block diagram showing a semiconductor integrated circuit according to a modification.

FIG. 9 is a block diagram showing a semiconductor integrated circuit 300a according to a modification. As described above with reference to FIG. 6, description will be made below regarding an audio amplifier IC 500a as an example usage of the semiconductor integrated circuit 300a. In the test mode, the audio amplifier IC 500a is capable of switching the selected signal, which is to be input to the output stage 330, from the pulse signal S1 generated by the pulse modulator 320 to one from among at least one or more internal digital signals $D_{AUX}$ generated by the DSP 502. An internal digital signal $D_{AUX}$ may be configured as serial data, parallel data, or otherwise a clock signal. Also, such an internal digital signal $D_{AUX}$ may be configured as a PWM signal or otherwise a PDM signal generated by the DSP 502. As an upstream stage of the output stage 330, a multiplexer 506 is arranged in order to allow the input signal of the output stage 330 to be selected.

In the test mode, by selecting the internal digital signal $D_{AUX}$, such an arrangement allows the internal digital signal $D_{AUX}$ to be acquired via the SWOUT terminal. This allows the operating state of the DSP 502 to be analyzed. It should be noted that the usage of the semiconductor integrated circuit 300a is not restricted to such an audio amplifier. Also, the semiconductor integrated circuit 300a may be applicable to a motor driver or a control circuit for a DC/DC converter.

[Sixth Modification]

The kind of package employed for the semiconductor integrated circuit 300 is not restricted in particular. Also, the present invention is applicable to various kinds of packages such as an SIP (Single Inline Package) package, PGA (Pin Grid Array) package, QFP (Quad Flat Package) package, and BGA (Ball Grid Array) package, in addition to the DIP (Dual Inline Package) shown in FIG. 1.

[Seventh Modification]

The application of the semiconductor integrated circuit 300 is not restricted to an ASIC (Application Specific IC). Also, the semiconductor integrated circuit 300 is applicable to general-purpose microcomputers, FPGAs (Field Programmable Gate Arrays), and the like.

While the preferred embodiments of the present invention have been described using specific terms, such description is for illustrative purposes only, and it is to be understood that changes and variations may be made without departing from the spirit or scope of the appended claims.

What is claimed is:

1. A semiconductor integrated circuit comprising:
an output terminal;
a pulse modulator that receives an analog voltage, and that generates a pulse signal modulated according to the analog voltage; and
an output stage that generates a switching signal at the output terminal according to the pulse signal,
wherein the semiconductor integrated circuit is switchable between (i) a normal mode in which a main signal to be used in a normal operating mode is input as the analog voltage to the pulse modulator, and (ii) a test mode in which at least one internal analog signal generated in the semiconductor integrated circuit is input as the analog voltage to the pulse modulator, and
wherein the pulse modulator comprises:
an error amplifier that receives, via an inverting input terminal thereof, the analog voltage and a voltage fed back from the output terminal, and that receives a reference voltage via a non-inverting input terminal thereof; and
a comparator that compares an output voltage of the error amplifier with a cyclic voltage, and that outputs a pulse signal that indicates a comparison result.

2. The semiconductor integrated circuit according to claim 1, further comprising a multiplexer that receives the main signal and the at least one internal analog signal, selects one from among the signals thus received, and outputs the signal thus selected to the pulse modulator.

3. The semiconductor integrated circuit according to claim 1, wherein the at least one internal analog signal includes a detection voltage output from a sensor built into the semiconductor integrated circuit.

4. The semiconductor integrated circuit according to claim 1, wherein the at least one internal analog signal includes a detection voltage output from a temperature sensor included in an overheat protection circuit built into the semiconductor integrated circuit.

5. The semiconductor integrated circuit according to claim 1, wherein the at least one internal analog signal includes a detection voltage output from a current sensor included in an overcurrent protection circuit built into the semiconductor integrated circuit.

6. The semiconductor integrated circuit according to claim 1, wherein the at least one internal analog signal includes a reference voltage.

7. The semiconductor integrated circuit according to claim 1, wherein the at least one internal analog signal includes a threshold voltage set for a protection circuit.

8. The semiconductor integrated circuit according to claim 1, wherein the output stage comprises:
a high-side transistor arranged between a power supply terminal and the output terminal;
a low-side transistor arranged between the output terminal and a ground terminal; and
a driver that drives the high-side transistor and the low-side transistor according to the pulse signal.

9. The semiconductor integrated circuit according to claim 1, configured as a control circuit for a switching regulator.

10. The semiconductor integrated circuit according to claim 1, configured as a motor driver circuit.

11. A semiconductor integrated circuit comprising:
an output terminal;
a pulse modulator that receives an analog voltage, and that generates a pulse signal modulated according to the analog voltage; and
an output stage that generates a switching signal at the output terminal according to the pulse signal,
wherein the semiconductor integrated circuit is switchable between (i) a normal mode in which a main signal to be used in a normal operating mode is input as the analog voltage to the pulse modulator, and (ii) a test mode in which at least one internal analog signal generated in the semiconductor integrated circuit is input as the analog voltage to the pulse modulator, and
wherein the output stage is structured to receive at least one internal digital signal generated by the digital signal processing circuit as its input signal instead of the pulse signal generated by the pulse modulator in the test mode.

12. An audio amplifier circuit comprising a semiconductor integrated circuit, wherein the semiconductor integrated circuit comprises:
an output terminal;
a pulse modulator that receives an analog voltage, and that generates a pulse signal modulated according to the analog voltage; and
an output stage that generates a switching signal at the output terminal according to the pulse signal,
wherein the semiconductor integrated circuit is switchable between (i) a normal mode in which a main signal to be used in a normal operating mode is input as the analog voltage to the pulse modulator, and (ii) a test mode in which at least one internal analog signal generated in the semiconductor integrated circuit is input as the analog voltage to the pulse modulator,
wherein the pulse modulator comprises:

an error amplifier that receives, via an inverting input terminal thereof, the analog voltage and a voltage fed back from the output terminal, and that receives a reference voltage via a non-inverting input terminal thereof; and a comparator that compares an output voltage of the error amplifier with a cyclic voltage, and that outputs a pulse signal that indicates a comparison result, and wherein the output stage comprises a class D amplifier.

13. An electronic device comprising:

an electroacoustic conversion element; and the audio amplifier circuit according to claim 12, that drives the electroacoustic conversion element.

* * * * *